(12) United States Patent
Blanchard et al.

(10) Patent No.: US 11,662,381 B2
(45) Date of Patent: May 30, 2023

(54) SELF-CONTAINED BUILT-IN SELF-TEST CIRCUIT WITH PHASE-SHIFTING ABILITIES FOR HIGH-SPEED RECEIVERS

(71) Applicant: International Business Machines Corporation, Armonk, NY (US)

(72) Inventors: Nathan Ross Blanchard, Austin, TX (US); Venkat Harish Nammi, Austin, TX (US); Dereje Yilma, Rochester, MN (US); Chad Andrew Marquart, Austin, TX (US); Glen A. Wiedemeier, Austin, TX (US); Jeffrey Kwabena Okyere, Carrollton, TX (US); Erik English, Salt Point, NY (US); Christopher Steffen, Rochester, MN (US); Vikram B Raj, Austin, TX (US); Michael Wayne Harper, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 17/405,173

(22) Filed: Aug. 18, 2021

(65) Prior Publication Data

US 2023/0055935 A1 Feb. 23, 2023

(51) Int. Cl.
*G01R 31/3177* (2006.01)
*G01R 31/317* (2006.01)
*G06F 1/08* (2006.01)

(52) U.S. Cl.
CPC ... *G01R 31/3177* (2013.01); *G01R 31/31724* (2013.01); *G01R 31/31727* (2013.01); *G06F 1/08* (2013.01)

(58) Field of Classification Search
CPC .......... G01R 31/3177; G01R 31/31724; G01R 31/31727; G06F 1/08
USPC ........................................ 714/733, 742, 744
See application file for complete search history.

(56) References Cited

U.S. PATENT DOCUMENTS

| | | |
|---|---|---|
| 6,816,987 B1 | 11/2004 | Olson et al. |
| 7,271,751 B2 | 9/2007 | Peterson et al. |
| 7,315,574 B2 | 1/2008 | Hafed et al. |
| 7,363,563 B1 | 4/2008 | Hissen et al. |

(Continued)

FOREIGN PATENT DOCUMENTS

| | | |
|---|---|---|
| EP | 1269687 A2 | 1/2003 |
| EP | 1814234 B1 | 1/2011 |
| EP | 1908205 B1 | 9/2011 |

OTHER PUBLICATIONS

Piplani et al., Test and Debug Strategy for High Speed JESD204B Rx PHY, 2017, IEEE, pp. 179-183. (Year: 2017).*

(Continued)

*Primary Examiner* — John J Tabone, Jr.
(74) *Attorney, Agent, or Firm* — Cantor Colburn LLP; Kelsey M. Skodje

(57) ABSTRACT

Aspects of the invention include a phase rotator, that is located at a built-in self-test (BIST) path of a receiver, receiving a clock signal from an on-chip clock. The phase rotator shifts the phases of the clock signal. The phase rotator transmits the shifted clock signal to a binary sequence generator, that is located at the receiver. The binary sequence generator outputs a binary sequence, where the binary sequence generator is driven by the shifted clock signal.

20 Claims, 5 Drawing Sheets

(56) References Cited

U.S. PATENT DOCUMENTS

| | | | |
|---|---|---|---|
| 7,464,307 | B2 | 12/2008 | Nejedlo et al. |
| 7,613,237 | B1 | 11/2009 | Talbot |
| 7,756,197 | B1 | 7/2010 | Ferguson et al. |
| 7,912,166 | B2 | 3/2011 | Hsu et al. |
| 8,228,972 | B2 * | 7/2012 | Tonietto ............... H04L 1/243 |
| | | | 455/75 |
| 8,598,898 | B2 | 12/2013 | Sul et al. |
| 8,811,458 | B2 | 8/2014 | Kong et al. |
| 8,989,246 | B2 | 3/2015 | Wu |
| 9,176,188 | B2 | 11/2015 | Chakraborty et al. |
| 10,476,658 | B1 * | 11/2019 | Ganesan ............... G11C 29/028 |
| 10,608,763 | B2 * | 3/2020 | Rell, III ............... H04L 1/242 |
| 10,802,077 | B1 * | 10/2020 | Srinivasan ............ G11C 29/32 |
| 11,528,102 | B1 | 12/2022 | Yilma et al. |
| 2002/0125933 | A1 | 9/2002 | Tamura et al. |
| 2004/0267479 | A1 | 12/2004 | Querbach et al. |
| 2005/0193290 | A1 * | 9/2005 | Cho ............... H04B 17/0085 |
| | | | 714/710 |
| 2007/0047635 | A1 | 3/2007 | Stojanovic et al. |
| 2009/0013228 | A1 * | 1/2009 | Jarboe, Jr. ............ G01R 31/3187 |
| | | | 714/E11.169 |
| 2009/0105978 | A1 | 4/2009 | Schuttert et al. |
| 2009/0302887 | A1 | 12/2009 | Kwasniewski et al. |
| 2011/0239031 | A1 * | 9/2011 | Ware ............... G06F 13/1689 |
| | | | 713/500 |
| 2013/0099702 | A1 | 4/2013 | Williams et al. |
| 2013/0145212 | A1 | 6/2013 | Hsu et al. |
| 2013/0294490 | A1 * | 11/2013 | Chandrasekaran ... H04L 7/0083 |
| | | | 375/226 |
| 2016/0329751 | A1 | 11/2016 | Mach et al. |
| 2019/0363813 | A1 * | 11/2019 | Rell, III ............... H04J 3/0658 |
| 2020/0200853 | A1 | 6/2020 | Horimoto et al. |

OTHER PUBLICATIONS

Kim et al., "An Effective Defect-Oriented BIST Architecture for High-Speed Phase-Locked Loops," Proceedings 18th IEEE VLSI Test Symposium, 2000, pp. 231-236.

Satyacathi et al., "Implementation of BIST Technique in UART Serial communication," IOSR Journal of VLSI and Signal Processing. vol. 4, Issue 5, Ver. 11, pp. 21-29.

List of IBM Patents or Patent Applications Treated as Related; Date Filed: Aug. 18, 2021, 2 pages.

* cited by examiner

SELF-CONTAINED BUILT-IN SELF-TEST CIRCUIT WITH PHASE-SHIFTING ABILITIES FOR HIGH-SPEED RECEIVERS

BACKGROUND

The present invention generally relates to integrated circuits, and more specifically, to integrated circuits configured for self-contained built-in self-test circuits with phase-shifting abilities for high-speed receivers.

An integrated circuit is an electronic circuit formed from a collection of semiconductor devices. Semiconductor devices are fabricated through a precise series of steps to produce semiconductor devices assembled for an integrated circuit. As part of the fabrication process, a semiconductor device is tested during the wafer fabrication, wafer probing, packaging, and final phases of fabrication. The testing process helps determine the reliability of the semiconductor devices and improves the fabrication process.

SUMMARY

Embodiments of the present invention are directed to a system for self-contained built-in self-test circuit with phase-shifting abilities for high-speed receivers. A non-limiting example of the system includes a phase rotator, that is located at a built-in self-test (BIST) path of a receiver, receiving a clock signal from an on-chip clock. The phase rotator shifts the phases of the clock signal. The phase rotator transmits the shifted clock signal to a binary sequence generator, that is located at the receiver. The binary sequence generator outputs a binary sequence, where the binary sequence generator is driven by the shifted clock signal.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
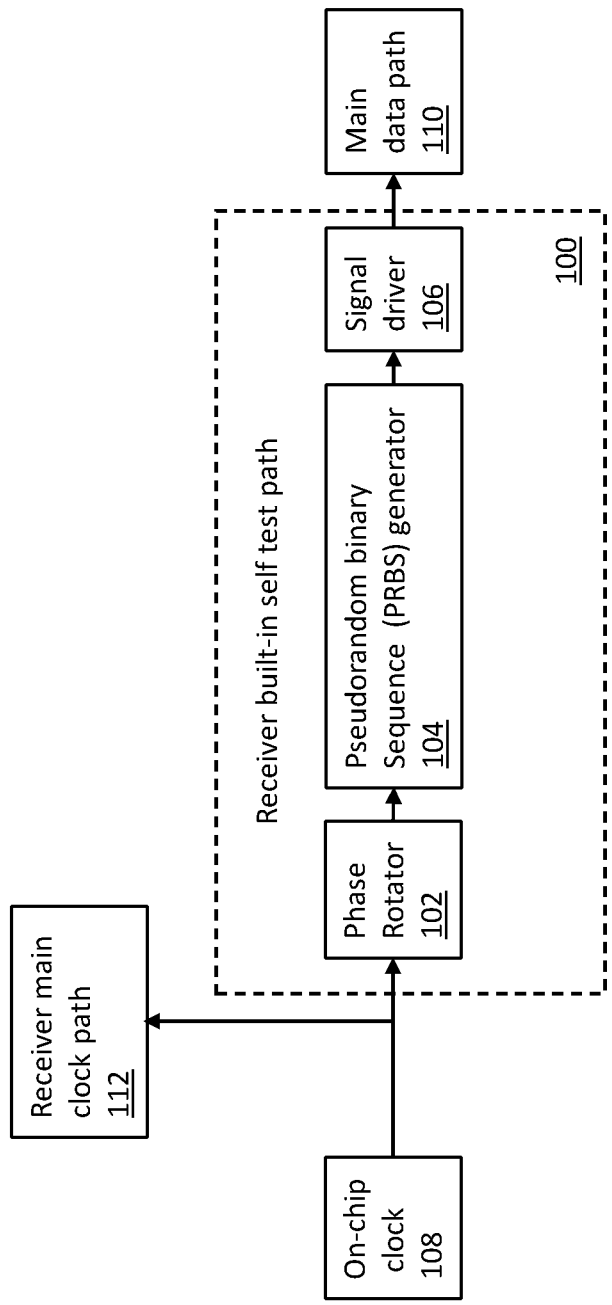
FIG. 1 illustrates a data path of a receiver of an integrated circuit with a self-contained built-in self-test circuit with phase-shifting abilities according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide a self-contained receiver for performing a testing phase on an integrated circuit. In accordance with one or more embodiments of the present invention, the receiver can generate a binary test sequence without being coupled to a transmitter.

A built-in self-test (BIST) circuit includes hardware that enables an integrated circuit to perform self-testing. A BIST circuit generally includes circuitry for pattern/sequence generation, timing, mode selection, and diagnostic tests. During a testing phase, a test sequence generator generates a test sequence to enabling self-testing of an aspect of the integrated circuit. In contemporary systems, the test sequence is generated at a transmitter side of the integrated circuit and transmitted to a receiver side of the integrated circuit via a loopback path. Therefore, in order to test the aspect of the device, the transmitter and the receiver must both be fabricated, and the transmitter must be connected to the receiver via the loopback path One or more embodiments of the present invention address one or more of the above-described shortcomings by providing a high-speed receiver with a built-in self-test (BIST) path that includes a phase rotator that is located within the BIST path of the receiver. The BIST path is self-contained within the receiver and, therefore, does not require a connection to the transmitter on the device being tested in order to perform a test. The phase rotator receives an incoming clock signal, shifts the phase of the signal, and outputs the shifted signal to a pseudorandom binary sequence (PRBS) generator. The PRBS generator receives the shifted phase signal and outputs a binary test sequence. By including the BIST path at the receiver side to generate test sequences, the receiver can be tested independently from the transmitter. As the receiver does not need to receive a test sequence from a transmitter, the sequence generation aspect of a transmitter does not need to be tested prior to testing the receiver. This reduces overall test time for a transmitter/receiver system.

This phase shifting functionality in the receiver's BIST path enables more testing coverage, as other blocks within the receiver can be stressed, including the main clock path phase rotator as well as latches responsible for data hand-off to other circuits. Furthermore, this BIST path is able to be tested within the receiver standalone, simplifying testing during the manufacturing process.

Referring to FIG. 1, a data path of a receiver with a self-contained BIST path with phase-shifting abilities (hereinafter, "BIST path 100"), is generally shown. The BIST path 100 includes a phase rotator 102 for shifting a phase of a clock signal from a local on-chip clock 108. The phase rotator 102 is operable to transmit the shifted clock signal to a pseudorandom binary sequence (PRBS) generator 104. The PRBS generator 104 is a circuit that applies an algorithm to generate a pseudorandom binary sequence of data and transmit the sequence to a signal driver 106. The signal driver 106 transmits the sequence to the high-speed receiver's main data path 110. By shifting the phase of the clock signal, the BIST path 100 can output deterministic binary test sequences from the PRBS generator 104 for self-testing without needing to receive a test sequence from a transmitter. It should be appreciated that the functionality described herein can be performed on an integrated circuit, such as the integrated circuit 420.

The local on-chip clock 108 outputs a clock signal to the phase rotator 102. The phase rotator 102 receives the output from the local on-chip clock 108 and shifts the phase of the clock signal. The phase shift can be increased or decreased relative to the initial phase, assuming that it is between the minimum and maximum phase shift that can be added by the phase rotator 102. The phase rotator's output drives the PRBS generator 104 to generate deterministic binary sequences. The deterministic binary sequences increase the coverage provided during the testing phase to better capture corner scenarios or other rare testing occurrences. Furthermore, as the binary test sequences are generated at the receiver, the receiver can perform a self-test while on a wafer, and prior to the wafer being sliced into individual dies.

The pseudorandom binary sequence (PRBS) generator 104 is a circuit that applies an algorithm to output a known and reproducible binary test sequence. The phase rotator 102 outputs a shifted clock signal to the PRBS generator 104. The PRBS generator 104 outputs a binary sequence of logical ones or zeros. Each outputted sequence is transmitted to a signal driver 106 to be used as a test pattern to test an aspect of the receiver.

Figure 2A:
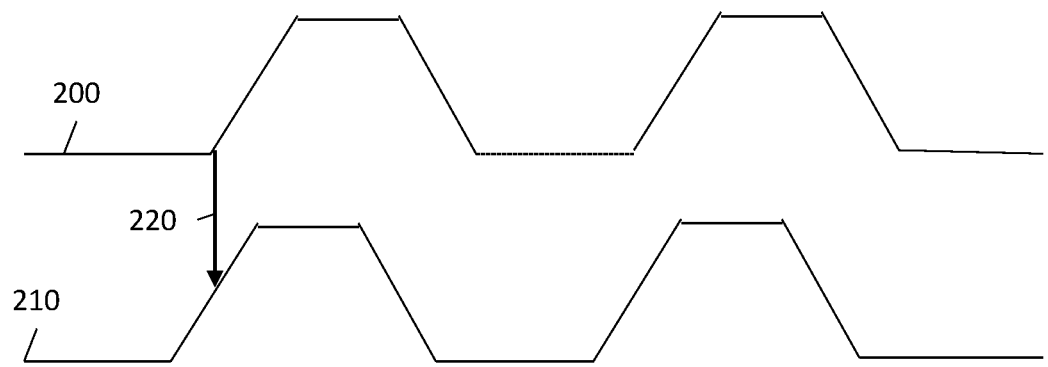
FIG. 2A illustrates a clock signal and a phase-shifted clock signal according to one or more embodiments of the present invention.
Figure 2B:
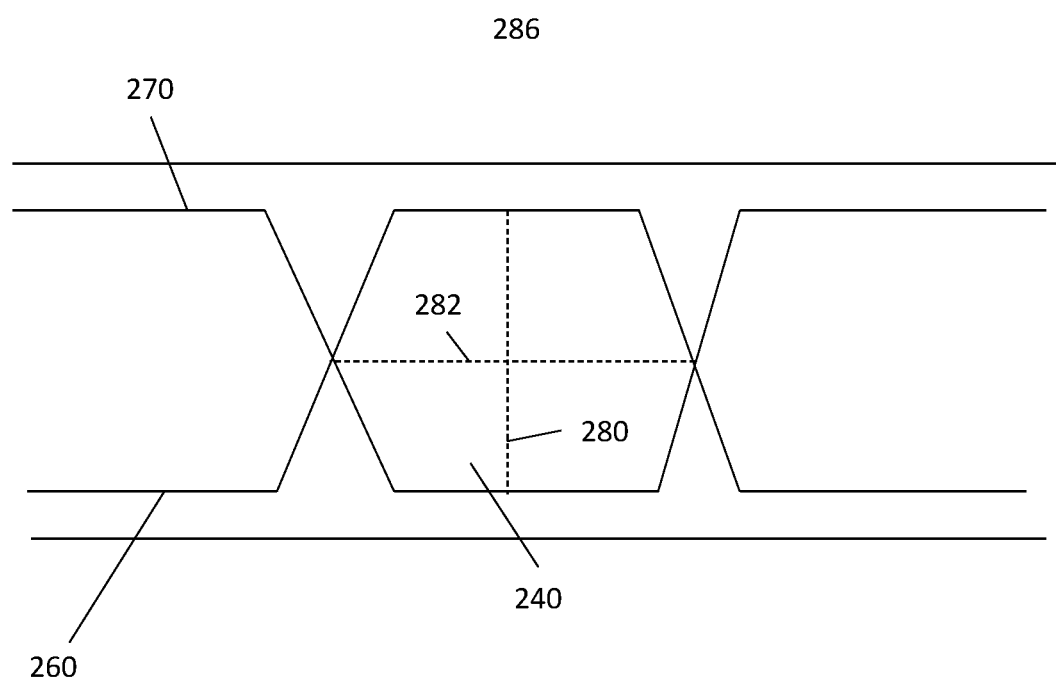
FIG. 2B illustrates a data eye according to one or more embodiments of the present invention.

Referring to FIG. 2A, an on-chip clock signal 200 is illustrated with a shifted clock signal 210. For illustration purposes, an arrow 220 is shown from the rising clock edge of the clock signal 200 to the rising edge of the shifted clock signal 210. As seen the phase rotator 102 has changed the phase of the shifted clock signal 210 relative to the clock signal 200. Referring to FIG. 2B, an output of the PRBS generator 104 represented as a data eye 240 is shown in accordance with one or embodiments of the present invention. The data eye 240 is comprised of a first waveform 260 superimposed on a second waveform 270, and is a representation of a high-speed digital signal outputted by the PRBS generator 104. The dimensions of each data eye can be analyzed to determine the average characteristics of the output of the PRBS generator 104. The average characteristics can be monitored and used to determine the quality of the signal transmitted through the receiver. The average characteristics include a mean eye height 280 and a mean eye width 282.

The BIST path 100 is able to stress additional portions of the receiver; for instance, the main clock path's phase rotator (part of the main clock path, but not shown). This circuit must function to correctly align with the shifted BIST data for sampling via a clock-data recovery (CDR) circuit to track any changes in phase. Additionally, the BIST path 100 is able to stress the captured data hand-off from the receiver (recovered clock) to the local on-chip clock 108 by shifting the BIST data until errors are seen.

Figure 3:
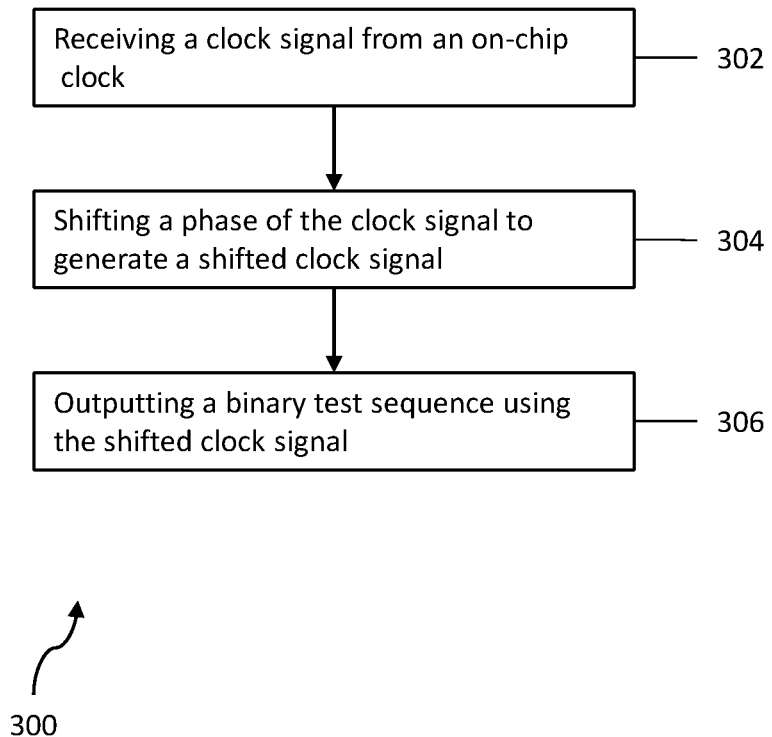
FIG. 3 illustrates a process flow for a built-in self-test circuit with phase-shifting abilities according to one or more embodiments of the present invention.

Referring to FIG. 3, a process flow 300 for testing a device using a self-contained built-in self-test circuit with phase shifting abilities, is shown in accordance with one or more embodiments of the present invention. At block 302, a phase rotator, of a BIST path 100, can receive a clock signal from a local on-chip clock 108. In some embodiments, a controller (not shown) can determine whether the receiver is in a test mode. If the BIST path 100 is in a test mode, the controller causes the local on-chip clock 108 to transmit the clock signal through the BIST path 100. If, however, the receiver is not in a test mode, the controller directs the local on-chip clock 108 to bypass the BIST path 100 and only transmit the clock signal through a main clock path 112.

At block 304, the phase rotator 102 shifts a clock signal outputted by the local on-chip clock 108. In particular, the phase rotator 102 is operable to cause the clock signal to increase a phase shift relative to a clock signal of the local on-chip clock 108, or decrease a phase shift relative to a clock signal on the local on-chip clock 108. The phase rotator 102 then outputs the shifted clock signal to a pseudorandom binary sequence (PRBS) generator 104.

At block 306, the PRBS generator 104 receives the shifted clock signal and outputs a binary sequence. The binary sequence is generated based on an algorithm and designed to test an aspect of a device. This generation of new test patterns is performed at the BIST path 100, and without a test sequence generated at a transmitter. The BIST path 100 then transmits the binary sequence to test the aspect of the receiver.

Figure 4:
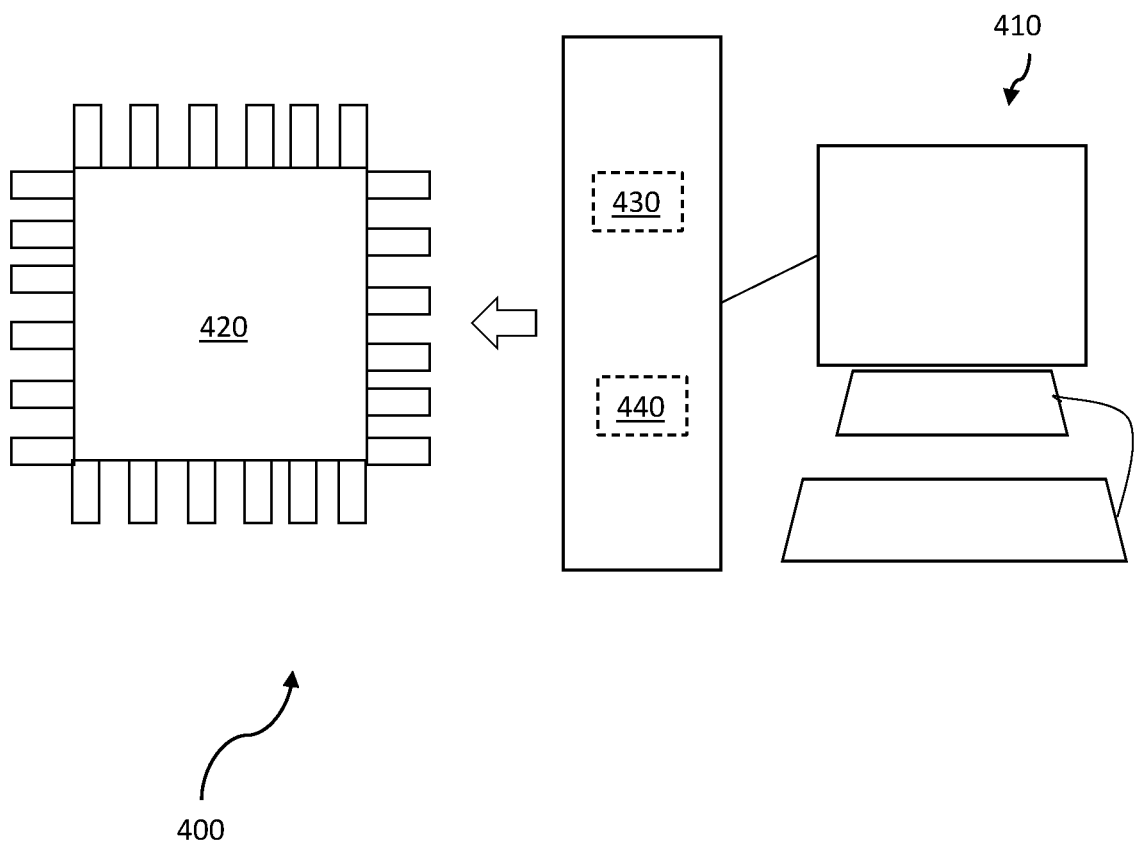
FIG. 4 illustrates a system used to generate the design used to fabricate an integrated circuit according to one or more embodiments of the present invention.

Referring to FIG. 4 a block diagram of a system 400 that includes a receiver with a BIST path 100 is shown. The system 400 includes processing circuitry 410 used to generate the design that is ultimately fabricated into an integrated circuit 420. The steps involved in the fabrication of the integrated circuit 420 are well-known and briefly described herein. Once the physical layout is finalized, based, in part, on a self-contained built-in self-test circuit with phase shifting-abilities according to embodiments of the invention to facilitate optimization of the routing plan, the finalized physical layout is provided to a foundry. Masks are generated for each layer of the integrated circuit based on the finalized physical layout. Then, the wafer is processed in the sequence of the mask order. The processing includes photolithography and etch. This is further discussed with reference to FIG. 5.

Figure 5:
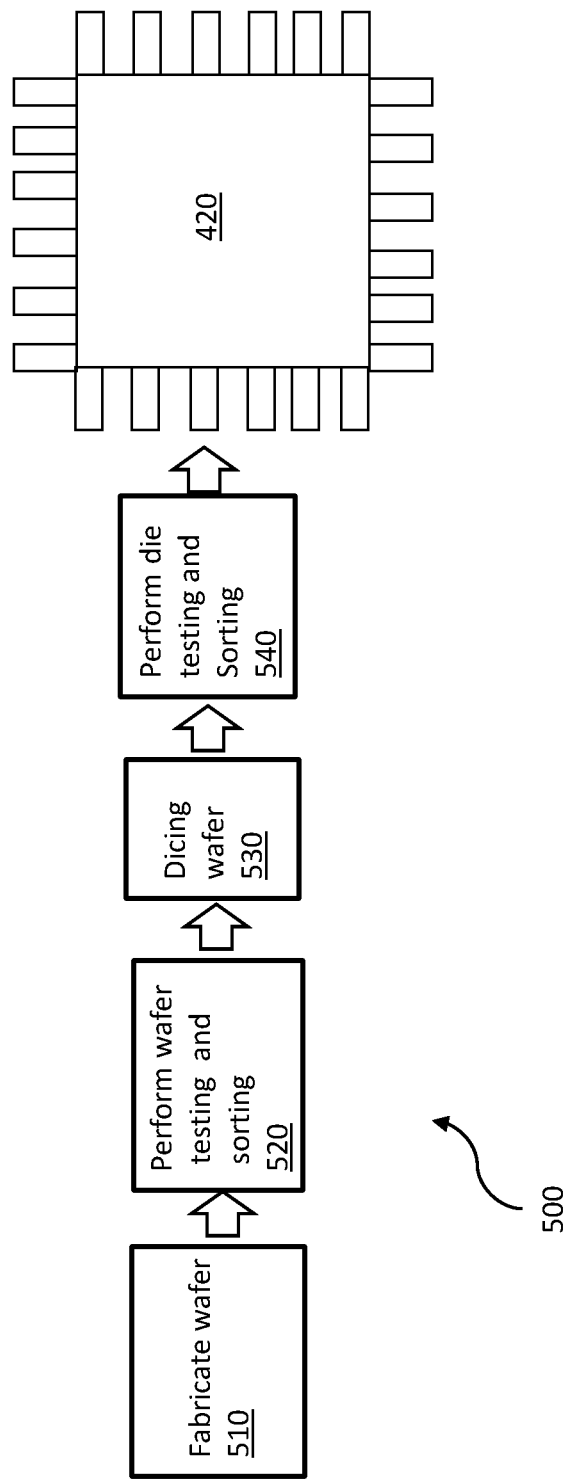
FIG. 5 illustrates a process flow of a method of fabricating an integrated circuit according to one or more embodiments of the present invention.

Referring to FIG. 5, a process flow of a method of fabricating the integrated circuit is shown according to exemplary embodiments of the invention. Once the physical design data is obtained, based, in part, on with a self-contained built-in self-test circuit with phase shifting abilities, the integrated circuit 420 can be fabricated according to known processes that are generally described with reference to FIG. 5. Generally, a wafer with multiple copies of the final design is fabricated and cut (i.e., diced) such that each die is one copy of the integrated circuit 420. At block 510, the processes include fabricating a wafer, including using masks to perform photolithography and etching. At block 520, performing wafer-level testing and wafer sorting. At block 530, dicing the wafer, and packaging functional dies. At block 540, performing die-level testing and sorting.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
receiving, by a phase rotator located at a built-in self-test (BIST) path of a receiver, a clock signal from an on-chip clock;
shifting, by the phase rotator, a phase of the clock signal;
transmitting, by the phase rotator, the shifted clock signal to a binary sequence generator located at the receiver; and
outputting, by the binary sequence generator, a binary sequence, wherein the binary sequence generator is driven by the shifted clock signal.

2. The computer-implemented method of claim 1, wherein the method further comprises self-testing the integrated circuit using the binary sequence.

3. The method of claim 2, wherein the method further comprises performing the self-test while the receiver is on a wafer and prior to wafer being sliced.

4. The computer-implemented method of claim 1, wherein the method further comprises transmitting the binary sequence to a main data path of the receiver.

5. The computer-implemented method of claim 1, wherein the method further comprises receiving, by the phase rotator arranged at the receiver and a receiver main clock path, the clock signal directly from an on-chip clock, the main path connected in common with an output of the on-chip clock and an input of the phase rotor.

6. The computer-implemented method of claim 1, wherein the binary sequence generator includes an input connected to an output of the phase rotor to receive the shifted clock signal and an output connected to a signal driver that receives the binary sequence, and wherein the method further comprises outputting the binary sequence to a data buffer arranged at the receiver.

7. The computer-implemented method of claim 1, wherein the method further comprising determining that the receiver is in a testing phase.

8. A system comprising:
a receiver;
a memory having computer readable instructions; and
one or more processors for executing the computer readable instructions, the computer readable instructions controlling the one or more processors to perform operations comprising:
receiving, by a phase rotator located at a built-in self-test (BIST) path at the receiver, a clock signal from an on-chip clock;
shifting, by the phase rotator arranged the receiver, a phase of the clock signal;
transmitting, by the phase rotator arranged at the receiver, the shifted clock signal to a binary sequence generator arranged at the receiver; and
outputting, by the binary sequence generator arranged at the receiver, a binary sequence, wherein the binary sequence generator is driven by the shifted clock signal.

9. The system of claim 8, wherein the operations further comprise self-testing the integrated circuit using the binary sequence.

10. The system of claim 9, wherein the operations further comprise performing the self-test while the receiver is on a wafer and prior to wafer being sliced.

11. The system of claim 8, wherein the operations further comprise transmitting the binary sequence to a main data path of the receiver.

12. The system of claim 8, wherein the operations further comprise receiving and a receiver main clock path, by the phase rotator, the clock signal directly from an on-chip clock, the main path connected in common with an output of the on-chip clock and an input of the phase rotor.

13. The system of claim 8, wherein the binary sequence generator includes an input connected to an output of the phase rotor to receive the shifted clock signal and an output connected to a signal driver that receives the binary sequence, and wherein the operations further comprise outputting the binary sequence to a data buffer arranged at the receiver.

14. The system of claim 8, wherein the operations further comprise determining that the receiver is in a testing phase.

15. A computer program product comprising a computer readable storage medium having program instructions embodied therewith, the program instructions executable by a processor to cause the processor to perform operations comprising:
receiving, by a phase rotator arranged at a receiver, a clock signal from an on-chip clock;
shifting, by the phase rotator arranged the receiver, a phase of the clock;
transmitting, by the phase rotator arranged at the receiver, the shifted clock signal to a binary sequence generator arranged at the receiver; and
outputting, by the binary sequence generator arranged at the receiver, a binary sequence, wherein the binary sequence generator is driven by the shifted clock signal.

16. The computer program product of claim 15, wherein the operations further comprise self-testing the integrated circuit using the binary sequence.

17. The computer program product of claim 15, wherein the operations further comprise transmitting the signal to a main data path of the receiver.

18. The computer program product of claim 15, wherein the operations further comprise receiving, by the phase rotator arranged at the receiver and a receiver main clock path, the clock signal directly from an on-chip clock, the main path connected in common with an output of the on-chip clock and an input of the phase rotor.

19. The computer program product of claim 15, wherein the binary sequence generator includes an input connected to an output of the phase rotor to receive the shifted clock signal and an output connected to a signal driver that receives the binary sequence, and wherein the operations further comprise outputting the binary sequence to a data buffer arranged at the receiver.

20. The computer program product of claim 15, wherein the operations further comprise determining that the receiver is in a testing phase.

* * * * *